(12) United States Patent
Noh et al.

(10) Patent No.: US 9,461,436 B2
(45) Date of Patent: Oct. 4, 2016

(54) PULSE LASER DEVICE AND BURST MODE USING SAME, AND METHOD FOR CONTROLLING A VARIABLE BURST MODE

(71) Applicant: GWANGJU INSTITUTE OF SCIENCE AND TECHNOLOGY, Gwangju (KR)

(72) Inventors: Young-Chul Noh, Gwangju (KR); Woojin Shin, Gwangju (KR); Bong-Ahn Yu, Gwangju (KR); Yeung Lak Lee, Gwangju (KR); Changsoo Jung, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 77 days.

(21) Appl. No.: 14/064,583

(22) Filed: Oct. 28, 2013

(65) Prior Publication Data
US 2014/0177033 A1    Jun. 26, 2014

Related U.S. Application Data

(63) Continuation of application No. PCT/KR2011/009557, filed on Dec. 13, 2011.

(30) Foreign Application Priority Data

Apr. 28, 2011    (KR) .................. 10-2011-0040088
Apr. 28, 2011    (KR) .................. 10-2011-0040089

(51) Int. Cl.
*H01S 3/10*    (2006.01)
*H01S 3/00*    (2006.01)
(Continued)

(52) U.S. Cl.
CPC ......... *H01S 3/10015* (2013.01); *H01S 3/0092* (2013.01); *H01S 3/06758* (2013.01); *H01S 3/2316* (2013.01); *H01S 5/0656* (2013.01); *H01S 3/0085* (2013.01); *H01S 5/0428* (2013.01)

(58) Field of Classification Search
USPC .............................. 359/326–332; 372/21–22
See application file for complete search history.

(56) References Cited

U.S. PATENT DOCUMENTS 6,078,422 A * 6/2000 Kosaka ................. H01S 3/1301
                                                        359/341.3
7,671,295 B2 * 3/2010 Sun ........................ B23K 26/04
                                                        219/121.6
(Continued)

FOREIGN PATENT DOCUMENTS

JP    2002344072 A    11/2002
JP    2005077470 A    3/2005
(Continued)

OTHER PUBLICATIONS

International Search Report for PCT/KR2011/009557 mailed Jul. 27, 2012.
(Continued)

*Primary Examiner* — Daniel Petkovsek
(74) *Attorney, Agent, or Firm* — Hauptman Ham, LLP

(57) ABSTRACT

The present invention relates to a pulse laser device, and more particularly, to a pulse laser device which can be operated in a burst mode, in which the output of a low-output laser generator is adjusted so as to enable the uniform control of the profile of the peak output of a final output optical pulse train, and in a variable burst mode, in which the profile of the final output optical pulse train can be controlled into an arbitrary waveform.

7 Claims, 11 Drawing Sheets

(51) Int. Cl.
*H01S 5/065* (2006.01)
*H01S 3/067* (2006.01)
*H01S 3/23* (2006.01)
*H01S 5/042* (2006.01)

(56) References Cited

U.S. PATENT DOCUMENTS

| | | | |
|---|---|---|---|
| 7,885,298 B2* | 2/2011 | Munroe | H01S 3/2308 372/21 |
| 8,009,705 B2 | 8/2011 | Keaton et al. | |
| 8,160,113 B2* | 4/2012 | Adams | B23K 26/063 372/25 |
| 2004/0032887 A1 | 2/2004 | Ahmadvand et al. | |
| 2005/0225846 A1 | 10/2005 | Nati et al. | |
| 2007/0248136 A1 | 10/2007 | Leonardo et al. | |
| 2011/0038031 A1* | 2/2011 | Starodoumov | H01S 3/06754 359/326 |
| 2012/0027031 A1* | 2/2012 | Liu | G02B 6/02214 372/6 |
| 2014/0049811 A1* | 2/2014 | Noh | H01S 3/0092 359/341.1 |

FOREIGN PATENT DOCUMENTS

| | | |
|---|---|---|
| JP | 2010115698 A | 5/2010 |
| JP | 2011003771 | 1/2011 |
| KR | 20000053399 A | 8/2000 |
| KR | 20020096376 A | 12/2002 |
| KR | 20030028675 A | 4/2003 |
| WO | 2012148062 A1 | 11/2012 |

OTHER PUBLICATIONS

U.S. Office Action dated Aug. 12, 2015 in connection with the counterpart U.S. Appl. No. 14/113,688.

* cited by examiner

PULSE LASER DEVICE AND BURST MODE USING SAME, AND METHOD FOR CONTROLLING A VARIABLE BURST MODE

CROSS REFERENCE TO RELATED APPLICATION

This application claims the priority of Korean Patent Application No. 10-2011-0040088, filed on Apr. 28, 2011 and Application No. 10-2011-0040089, filed on Apr. 28, 2011 in the Korean Patent and Trade Mark Office. Further, this application is the PCT-Continuation application of International Application No. PCT/KR2011/009557 filed on Dec. 13, 2011, which is incorporated herein by reference in its entirety.

TECHNICAL FIELD

The present invention relates to a pulse laser device, and more particularly, to a pulse laser device which can be operated in a burst mode, in which an output of a low-output laser generator is controlled so as to enable a uniform control of a profile of a final output optical pulse train, and in a variable burst mode, in which the profile of the final output optical pulse train can be controlled into an arbitrary form, and a method for controlling the same.

Further, the present invention relates to a pulse laser device which includes multiple laser generators and a laser source outputting an optical pulse and a laser source outputting a continuous wave and which can be operated in a burst mode, in which a duration of the continuous wave is controlled so as to enable a uniform control of a profile of an optical pulse train, and in a variable burst mode, which a profile of a final output optical pulse train can be controlled into an arbitrary waveform, and a method for controlling the same.

BACKGROUND ART

For precision machining of parts in electronics industry, and the like, a laser machining technology has been gradually developed to be an ultra-precise, ultra fast, and large area machining technology. In particular, for machining of parts in a micro electronics industry field including a semiconductor, a display, a solar cell, a next generation high value added/high functional PCB, a next generation packaging industry, and the like, ultra-precise machining is essential.

For micro-sized ultra-precise machining, high-performance laser specifications are required. For micro machining, a laser of an ultraviolet region is used or femtosecond and picosecond pulse laser beams having a very short pulse width are used. At the same time, a high-quality laser, in which a spatial distribution of a laser beam is a single mode, is required. Further, for implementing the high speed and the large area, a high-repetition-rate, high-output pulse laser is required.

An example of a method for operating a laser in a pulse may include a Q switching method and a mode locking method. In case of laser diode, a method for directly modulating an applied current so as to be operated in a pulse is used.

A pulse having a pulse width from several nanoseconds to several microseconds may be generated by using the Q switching method and a pulse having a pulse width from several femtoseconds to several hundreds of picoseconds region may be generated by using the mode locking method.

The laser diode may be operated to enable a continuous wave in a pulse having a pulse width of several hundreds of picoseconds depending on the current modulation. A high-output pulse laser system having a high-quality laser beam uses a master oscillator power amplifier (MOPA) type which is configured to include a low-output, high-quality pulse laser resonator and an amplifier amplifying an output of the resonator to a high output.

In this case, the amplifier is configured of a single stage or a multi-stage depending on a magnitude of a final output. Recently, a low-output laser diode (LD) is used as the pulse generator and a structure in which an output of the laser diode (LD) is amplified by a multi-stage optical fiber amplifier or a laser crystal amplifier so as to be amplified to a high output is used. Generally, the high-output, high-quality laser is operated in a near infrared (NIR) region by using a laser gain medium containing rare earth ions (representatively, Nd, Yb, Er, Tm ions, and the like). The high-output, high-quality pulse laser in a visible or ultraviolet (UV) region has mainly used a method for wavelength-converting a near infrared laser output into a nonlinear photonic crystal so as to be output.

FIG. 1 is a diagram illustrating a burst mode operating method of laser according to the related art.

Referring to FIG. 1, modulation of output light which is not wavelength-converted by a nonlinear wavelength conversion and optical separator 4 via a multi-amplifier including a plurality of amplifiers 3-1, . . . , 3-N from a laser generator 2 operated in a wavelength conversion laser using a nonlinear photonic crystal, that is, a pulse may be operated in various types of burst modes by controlling an intensity of an output pulse using an optical modulator 6 before a final output terminal or a nonlinear wavelength converter.

However, the method needs to use the high-output optical modulator to control a light intensity of the final output terminal. The high-output optical modulator may be expensive and difficult to perform a high speed operation.

To solve the above disadvantages, a method of simply modulating a low-output input pulse as illustrated in FIG. 2 is disclosed. Referring to FIG. 2, a method for simply on-off modulating an optical pulse of a laser diode or a pulse resonator used as a pulse generator 12 by operating a modulator 14 so as to modulate a pulse of a visible and ultraviolet wavelength which is final output light in a burst mode may be attempted.

However, as illustrated in FIG. 2, when a pulse is not input to a multi-amplifier including a plurality of amplifiers 13-1, . . . , 13-N from the pulse generator 12 for a predetermined time, energy is continuously accumulated in an amplifier medium. Therefore, when a subsequent pulse is input, a laser pulse is very strongly amplified, and thus the amplifier medium is damaged due to the amplified pulses P1 and P2. The pulse passing through the nonlinear wavelength converter is also output to the pulses P1 and P2 in the amplified state.

FIG. 3 is a graph illustrating a relationship between the energy accumulated in the amplifier medium and a saturation time when excitation energy is continuously applied from the amplifier.

Referring to FIG. 3, the energy accumulated for a predetermined time, that is, till the saturation time is continuously increases. The saturation time is changed depending on the amplifier medium, but in case of rare earth ions, generally ranges from several microseconds to several milliseconds.

FIG. 4 is a graph illustrating characteristics of the energy accumulated in the amplifier medium and an input optical pulse and an output optical pulse, when the input optical pulse is periodically input, amplified, and output, with continuously applying the excitation energy from the amplifier.

Referring to FIG. 4, when an input pulse of the amplifier and an output pulse of the amplifier are uniformly input, a distribution graph of energy to time also forms a uniform profile.

Hereinafter, a relationship between the input pulse and the output pulse of the amplifier output from the pulse generator will be described in more detail.

Referring to FIG. 5, in a pulse laser system having a MOPA structure, the low-output pulse generator has a repetition rate of a predetermined region and periodically generates the optical pulse. Generally, the excitation energy is continuously applied to the amplifier in a high-repetition-rate laser system uniformly.

Recently, a high-output laser diode having a continuous wave is generally used. The temporally uniformly applied energy is accumulated in the amplifier medium over time.

Most of the accumulated energy is consumed to amplify the input optical pulse. After the optical pulse amplification, the energy is again accumulated till the subsequent optical pulse is input and when the subsequent optical pulse is input, the energy is consumed to amplify the optical pulse again.

When the optical pulse is periodically input and the input optical pulse is not input for a predetermined time (t1 and t2 of FIG. 5), the energy accumulated in the amplifier medium is very large (E1 and E2 of FIG. 5) and when the optical pulse is input to the amplifier in this state, the optical pulse is very largely amplified (P1 and P2 of FIG. 5). The very largely amplified optical pulse leads to instability of an output of a laser system and causes damage to the amplifier medium and the optical system.

Therefore, simply on-off modulating and amplifying the optical pulse of the pulse generator leads to the instability of the output of the laser system and causes damage to the amplifier medium and the optical system after the amplifier terminal.

DISCLOSURE

Technical Problem

The present invention is directed to providing a pulse laser device capable of preventing instability of an output of a laser system and damage to an amplifier medium and an optical system, by including a standby signal in a seed laser signal generated from a laser generator to prevent energy from being accumulated in a subsequent amplifier, in a laser system having a MOPA structure.

Further, the present invention is directed to providing a control method for enabling a stable burst mode operation by consuming energy accumulated in an amplifier in real time in a quiet period in which a pulse signal is not generated from a laser device.

Further, the present invention is directed to providing a method for controlling a variable burst mode capable of controlling a profile of a final output pulse train by controlling a generation time of a standby signal so as to control a peak output of a subsequent pulse signal.

Further, the present invention is directed to providing a pulse laser device capable of preventing instability of an output of a laser system and a damage to an amplifier medium and an optical system by including a source outputting an optical pulse and a source outputting continuous wave in a laser generator and controlling the optical pulse and the continuous wave so as to prevent energy from being accumulated in a subsequent amplifier, in a laser system having a MOPA structure.

Further, the present invention is directed to providing a control method for enabling a stable burst mode operation by consuming energy accumulated in an amplifier in real time in a quiet period in which a pulse signal is not generated from a laser device.

Further, the present invention is directed to providing a method for controlling a variable burst mode capable of controlling a profile of a final output pulse train by controlling a generation time of a standby signal so as to control a peak output of a subsequent pulse signal.

Further, the present invention is directed to providing a pulse laser device by including a plurality of pulse laser sources generating optical pulses having different wavelengths to generate various patterns of output pulses, a burst mode using the same, and a method for controlling a variable burst mode.

Technical Solution

According to an aspect of the present invention, there is provided a pulse laser device including: a laser generator which generates a seed laser signal; and an optical amplifier which amplifies the seed laser signal, wherein the laser generator generates the seed laser signal including pulse signals and a standby signal and generates the standby signal to consume energy of the optical amplifier in a quiet period between the pulse signals.

The output of the standby signal may be preferably a continuous wave (CW) and a magnitude of the output may be preferably a magnitude obtained by multiplying a duty ratio by a peak output. That is, the magnitude of the output of the standby signal may be preferably similar (about ±50%) to an average output of the pulse signal.

The laser generator may be configured to include a laser diode and a laser diode driver which controls current applied to the laser diode or a laser resonator which is operated by a continuous wave and an optical modulator which modulates the continuous wave generated from the laser resonator into the pulse signal or the standby signal.

The optical amplifier may be configured of a single amplifier or a multi-stage amplifier and may include an optical fiber amplifier or a laser crystal amplifier.

According to another aspect of the present invention, there is provided a pulse laser device including: a laser generator which generates a seed laser signal including pulse signals and a standby signal of which the output intensity is an average output of the pulse signal, that is, a product of a peak output of the pulse signal and a duty ratio; an optical amplifier which amplifies the seed laser signal to generate the amplified signal; a nonlinear wavelength converter which nonlinearly outputs a wavelength conversion signal depending on an intensity of the amplified signal; and an optical separator which separates an output pulse from the wavelength conversion signal.

The laser generator may output the continuous wave as the standby signal and control a sustain time of the continuous wave to control the intensity of the peak output of the subsequent pulse signal.

The optical separator may separate light according to a wavelength of the wavelength conversion signal and may include any one of a dichroic mirror, a prism, and a grating.

According to another aspect of the present invention, there is provided a method for controlling a burst mode of a pulse laser device including: a laser generator which generates a seed laser signal including pulse signals and a standby signal; and an optical amplifier which amplifies the seed laser signal to generate the amplified signal, wherein when a time of a quiet period in which the pulse signal is not generated exceeds a time of a reference quiet period, the laser generator generates the standby signal before the quiet period as much as the exceeding time of the reference quiet period. The reference quiet period may be substantially a period of the pulse, more accurately, may mean a value obtained by subtracting a pulse width from the period of the pulse signal.

According to another aspect of the present invention, there is provided a method for controlling a burst mode of a pulse laser device including: a laser generator which generates a seed laser signal including pulse signals and a standby signal; and an optical amplifier which amplifies the seed laser signal to generate the amplified signal, wherein the laser generator may control an amplification intensity of each of the pulse signals by varying a generation time of the standby signal in a quiet period in which the pulse signal is not generated to control a profile of a pulse train.

According to another aspect of the present invention, there is provided a pulse laser device including: a laser generator including a pulse laser source which outputs the optical pulse, a continuous laser source which outputs a continuous wave, a laser source driver which controls an operation time of the pulse laser source and the continuous laser source, and a light guide unit which guides seed laser signals generated from the pulse laser source and the continuous laser source to the subsequent optical amplifier; and an optical amplifier which amplifies the seed laser signal, wherein the laser source driver drives the pulse laser source and the continuous laser source together.

The continuous wave may be preferably a continuous wave (CW) and a magnitude of the output may be preferably a magnitude obtained by multiplying a duty ratio by a peak output. That is, the output magnitude of the continuous wave may be preferably similar (about ±50%) to an average output of the optical pulse.

The pulse laser source or the continuous laser source may include a laser diode.

The pulse laser source and the continuous laser source each may have a wavelength within an amplifier gain wavelength band. When the plurality of gain wavelength bands of the amplifier may be present, each laser source may be configured to have wavelengths of each gain wavelength band.

The light guide unit may include an optical fiber coupler, be configured of an optical fiber switch which is controlled by the laser source driver, or be configured of free space optics such as a polarizer.

For a multi-wavelength burst mode operation, at least two pulse laser sources may be provided and the pulse laser sources each may preferably output optical pulses having different wavelengths.

According to another aspect of the present invention, there is provided a pulse laser device including: a laser generator including at least one pulse laser source which outputs the optical pulse, a continuous laser source which outputs a continuous wave, a laser source driver which controls an operation time of the pulse laser source and the continuous laser source, and a light guide unit which guides the seed laser signals generated from the pulse laser source and the continuous laser source to the subsequent optical amplifier; an optical amplifier which amplifies the seed laser signal to output the amplified signal; a nonlinear wavelength converter which nonlinearly outputs a wavelength conversion signal depending on an intensity of the amplified signal, and an optical separator which separates the wavelength conversion light and the optical signal which is not wavelength-converted from the signal of the wavelength converter.

The laser source driver may drive the at least one pulse laser source and continuous laser source together to control the energy accumulated in the optical amplifier by the continuous wave.

When the output signal of the laser device is output as a multi-wavelength, the wavelength converter may be configured of a multi wavelength converter of which the wavelength conversion efficiency is optimized for each wavelength.

According to another aspect of the present invention, there is provided a method for controlling a burst mode of a pulse laser device including: a laser generator including at least one pulse laser source which outputs the optical pulse, a continuous laser source which outputs a continuous wave, a continuous laser source which outputs a continuous wave, a laser source driver which controls an operation time of the pulse laser source and the continuous laser source, and a light guide unit which guides the seed laser signals generated from the pulse laser source and the continuous laser source; an optical amplifier which amplifies the seed laser signal; a wavelength converter which nonlinearly wavelength-converts the signal of the optical amplifier; and an optical separator which separates the output signal of the wavelength converter depending on the wavelength.

When the time of the quiet period in which the optical pulse is not generated exceeds the time of the reference quiet period, the laser source driver of the laser generator may operate the continuous laser source as much as the exceeding time of the reference quiet time to output the continuous wave.

For the variable burst mode operation, the laser source driver of the laser generator may control the peak outputs of each of the subsequent optical pulses by varying the operation time of the continuous laser source in the quiet period in which the optical pulse is not generated to control the profile of the pulse train.

Advantageous Effects

As set forth above, according to the present invention, the pulse laser device can control the output of the laser generator to form the output pulse and change the repetition rate and the pulse width, enable the variable burst mode controlling the temporal pattern of the pulse train, and be manufactured as the small, light laser and have the excellent economic efficiency since it does not use the additionally expensive high-output optical modulator.

Further, according to the present invention, when the pulse of the laser generator is not input to the amplifier for a predetermined time at the time of modulating the pattern of the pulse train over time so as to enable the variable burst mode in a laser, since the pulse is not input to the amplifier as the continuous wave, the damage to the amplifier terminal can be prevented and the instability of the laser output can be prevented.

Further, according to the present invention, the pulse laser device can use the plurality of pulse laser sources to generate various patterns of output pulses.

DESCRIPTION OF DRAWINGS

The above and other objects, features and advantages of the present invention will become apparent from the following description of preferred embodiments given in conjunction with the accompanying drawings, in which.

BEST MODE

Hereinafter, a pulse laser device, a burst mode using the same, and a method for controlling a variable burst mode according to the present invention will be described in detail.

Figure 1:
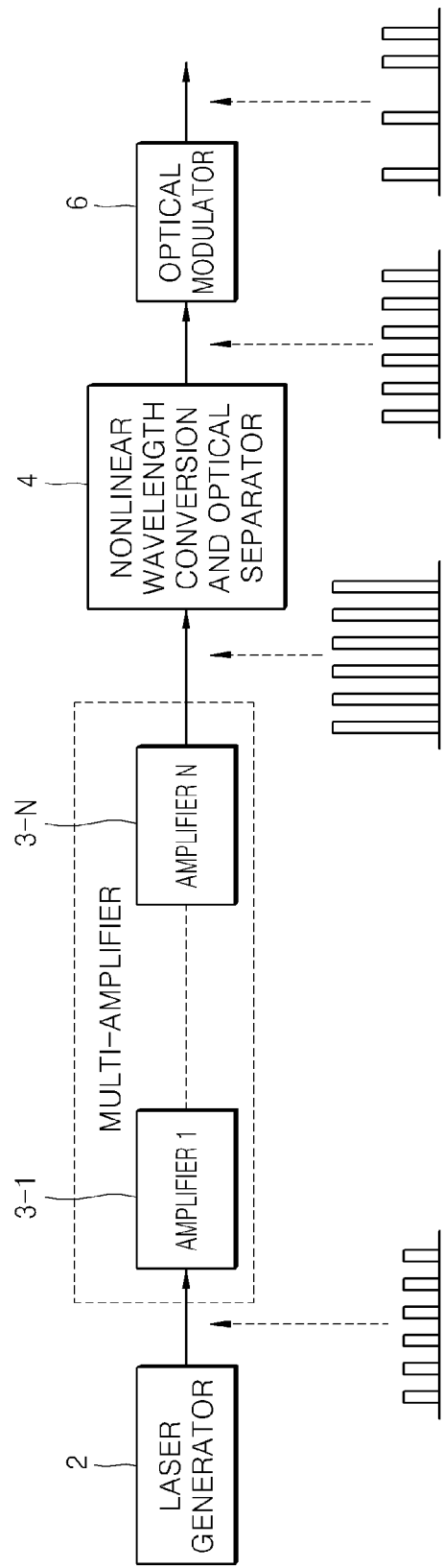
FIG. 1 is a block diagram illustrating an internal structure of a burst mode oscillator in a laser system according to the related art.
Figure 2:
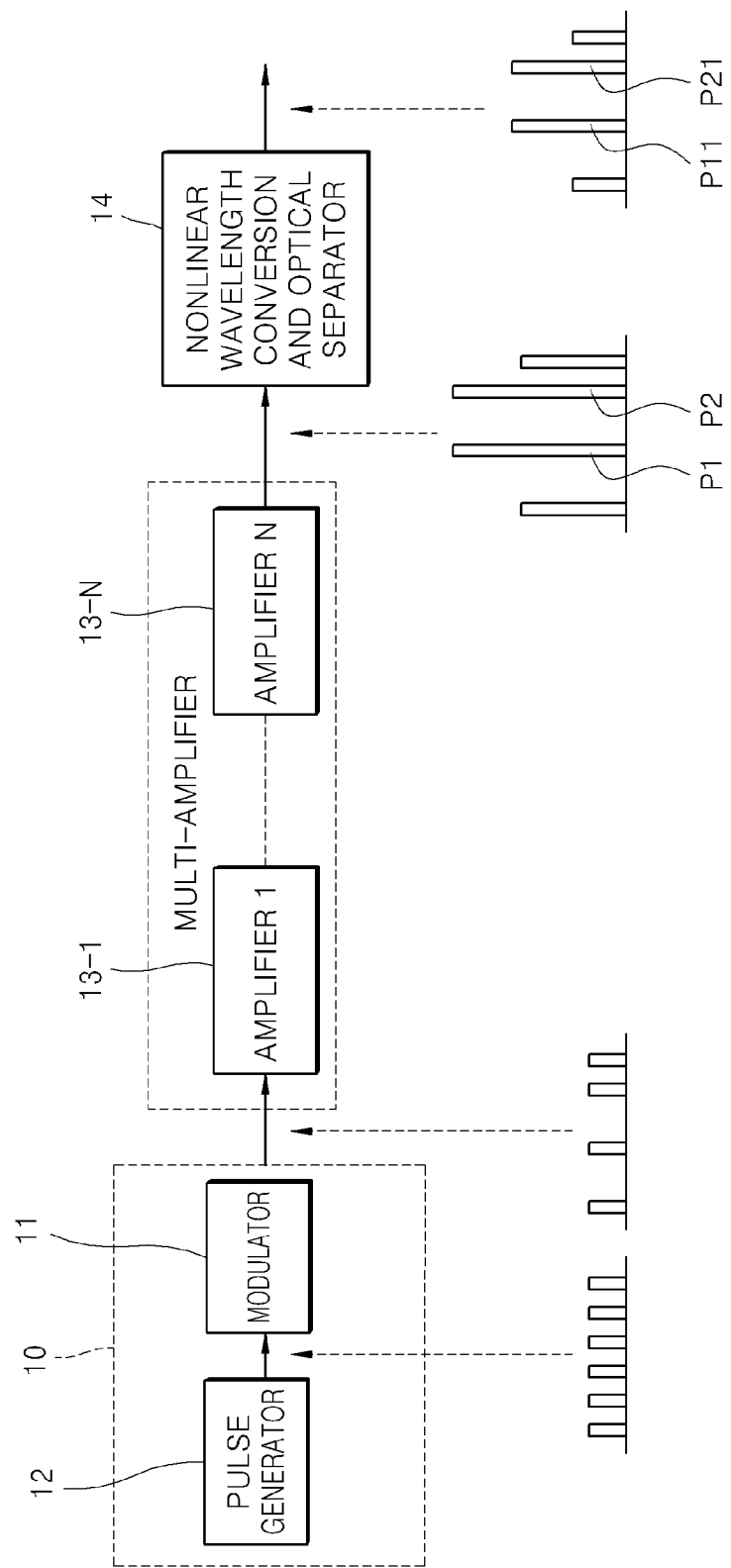
FIG. 2 is a block diagram for describing a change in a final output of an amplifier and a nonlinear wavelength converter when an optical pulse of a pulse generator according to the related art is simply modulated.
Figure 3:
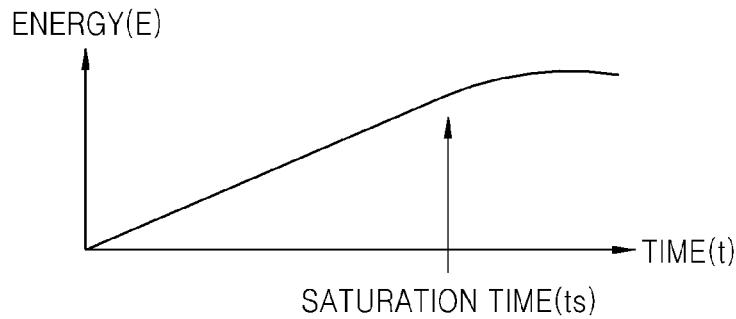
FIG. 3 is a graph illustrating a relationship between the energy accumulated in an amplifier medium and a saturation time when excitation energy is continuously applied from the amplifier.
Figure 4:
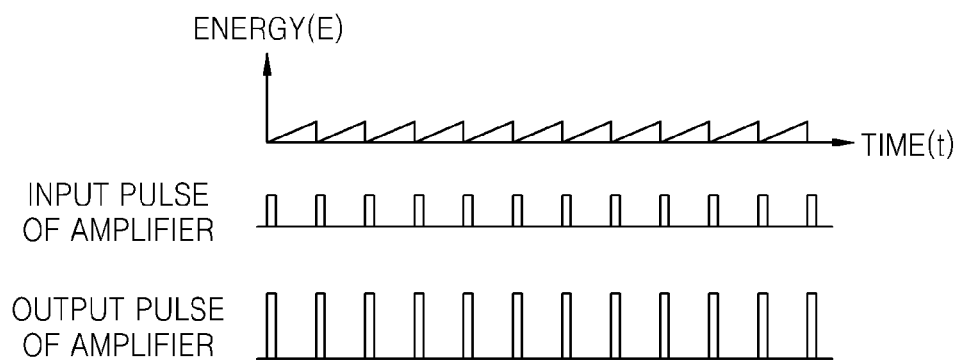
FIG. 4 is a graph illustrating characteristics of the energy accumulated in the amplifier medium and an input optical pulse and an output optical pulse, when the input optical pulse is periodically input, amplified, and output, with continuously applying the excitation energy from the amplifier.
Figure 5:
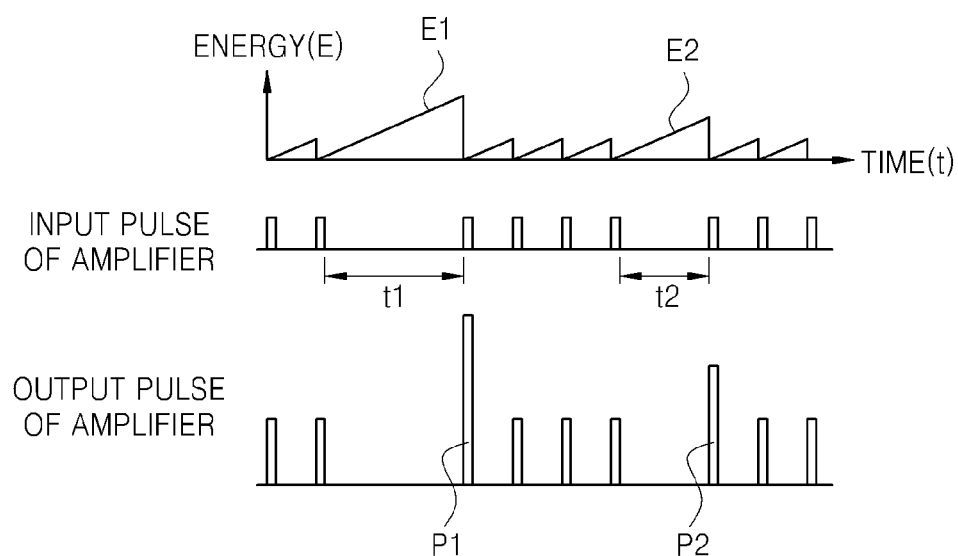
FIG. 5 is a graph illustrating characteristics of the energy accumulated in the amplifier medium and the input optical pulse and the output optical pulse at the time of simply on-off modulating an input pulse input to the amplifier.
Figure 6:
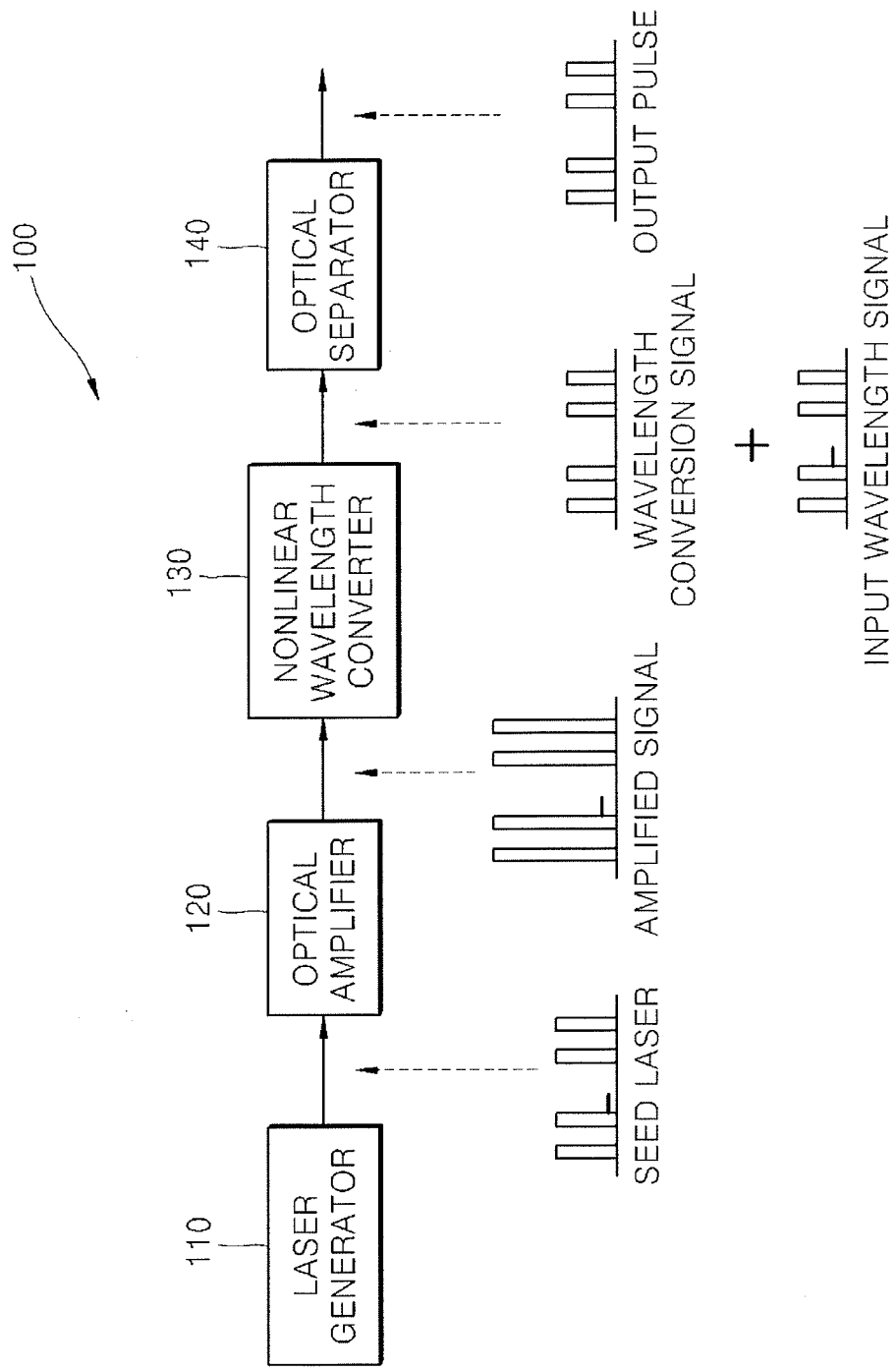
FIG. 6 is a block diagram illustrating a configuration of a pulse laser device according to an embodiment of the present invention.

FIG. 6 is a diagram showing a configuration of a pulse laser device according to the present invention.

As illustrated, a pulse laser device 100 according to the present invention includes a laser generator 110 which generates a seed laser signal including a pulse signal and a standby signal, an optical amplifier 120 which amplifies the seed laser signal to output an amplified signal, a nonlinear wavelength converter 130 which nonlinearly outputs a wavelength conversion signal depending on an intensity of the amplified signal, and an optical separator 140 which separates a wavelength conversion output pulse from an output of the wavelength converter.

The laser generator 110 may output both of the pulse signal and the standby signal, in which the standby signal is generated in a quiet period between the pulse signals.

The laser generator 110 may be configured to include a laser diode or a laser resonator. The standby signal generated from the laser generator 110 is to consume energy accumulated in the subsequent optical amplifier 120. When the pulse signal is not input for a predetermined time, the energy is continuously accumulated in an amplifier medium of the optical amplifier 120 and thus the subsequently input pulse signal is much stronger amplified than another pulse signal and in case of the present invention, the standby signal may consume the energy accumulated in the optical amplifier 120 in real time to prevent the excessive amplification.

In this case, the output of the standby signal is preferably a continuous wave (CW) and an output magnitude thereof is preferably a magnitude obtained by multiplying a duty ratio by a peak output. That is, the output magnitude of the standby signal is preferably similar to an average output of a pulse signal. When the output magnitude of the standby signal is much smaller than the average output of the pulse signal, the amplification by the standby signal is not sufficiently generated in the amplifier and thus the energy consumption of the amplifier by the standby signal is insufficient, such that the excessive amplification of the subsequent pulse signal may occur.

Although the output magnitude of the standby signal may be different depending on the characteristics of the amplifier, the output magnitude of the standby signal needs to be set to be at least 10% of the average output of the pulse signal, preferably 50% or more. When the signal amplified by the amplifier has a large amplification factor, an intensity of the amplified output light mainly depends on an intensity of excitation light rather than on an intensity of incident light. Therefore, when the intensity of the output of the standby signal input to the amplifier is larger than the intensity of the average output of the pulse signal, the average output of the amplifier may be slightly changed, but when the standby signal does not have a magnitude enough to cause the damage to the optical system of the input unit of the amplifier, no problem is caused to the performance of the present invention.

The optical amplifier 120 may be formed by connecting a plurality of amplifiers in a multi stage. The optical amplifier 120 may include an optical fiber amplifier or a laser crystal amplifier. In more detail, the optical amplifier 120 configured by connecting the plurality of optical fiber amplifiers and the plurality of crystal amplifiers may be used, but is not limited thereto.

The nonlinear wavelength converter 130 nonlinearly wavelength-converts the amplified signal output from the optical amplifier 120 to output a wavelength conversion signal.

When the amplified signal of the optical amplifier 120 is input to the nonlinear wavelength converter 130, the pulse signal having a strong peak output is effectively wavelength-converted, but the standby signal having a weak peak output is not substantially wavelength-converted. Generally, in the wavelength converter optimized for the pulse signal, the pulse signal is wavelength-converted as much as several % to tens of % and the continuous wave (CW) signal having the same average output is not substantially wavelength-converted. Therefore, when the pulse signal is input to the wavelength converter, the wavelength conversion signal of several to tens of % and the rest input wavelength signal which is not wavelength-converted is output and when the continuous wave signal is input, the wavelength conversion is not substantially generated and the input wavelength signal is output as it is.

The optical separator 140 serves to separate the wavelength-converted signal in the output of the nonlinear wavelength converter from the input wavelength signal which is not wavelength-converted. Therefore, the final output signal becomes the wavelength-converted pulse output.

Figure 7:
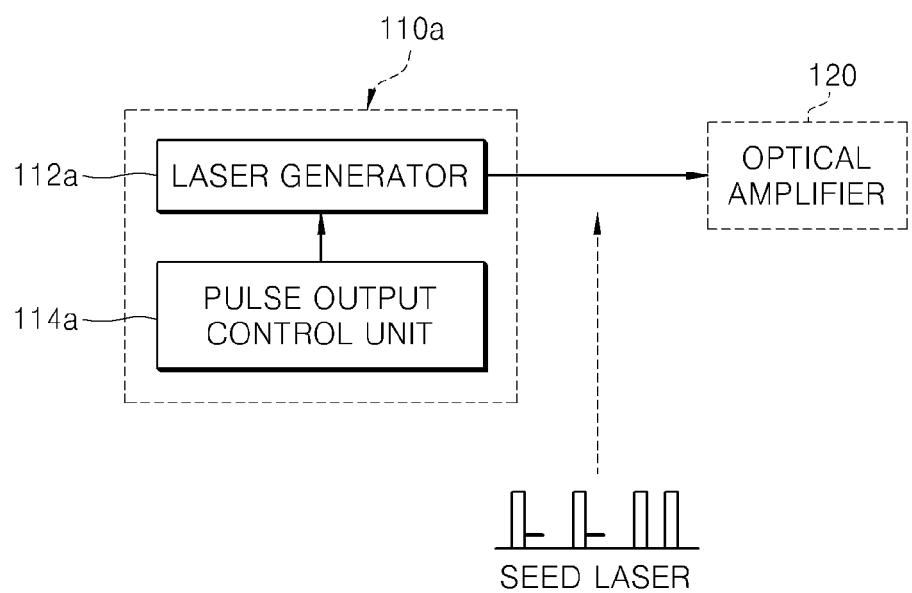
FIG. 7 is a block diagram illustrating a structure of a laser generator using a laser diode.

FIG. 7 is a block diagram illustrating a structure of a laser generator using a laser diode according to the present invention. Referring to FIG. 7, a laser generator 110 illustrated includes a laser diode 112a and a laser diode driver 112b which controls current supplied to the laser diode. The laser diode 112a may output the pulse signal or the standby signal which is the continuous wave, according to the applied current.

Figure 8:
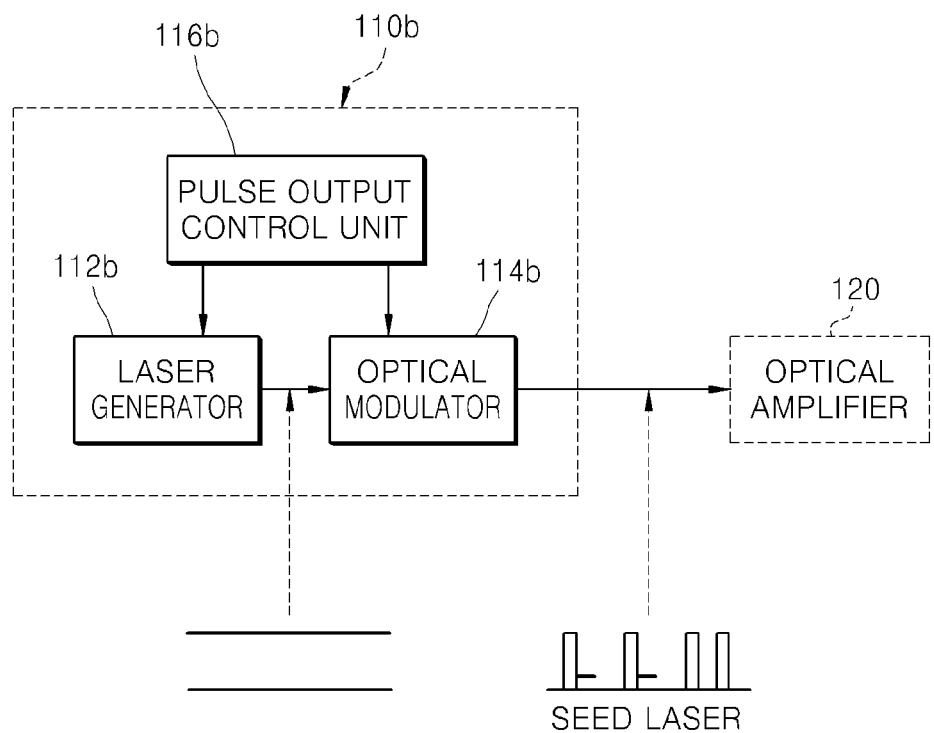
FIG. 8 is a block diagram illustrating a structure of a laser generator using a laser resonator.

FIG. 8 is a block diagram illustrating a structure of a laser generator using a laser resonator according to the present invention.

Referring to FIG. 8, the laser generator 110b illustrated includes a laser resonator 112b, an optical modulator 114b, and a pulse output control unit 116b for controlling the laser resonator 112b and the optical modulator 114b. In this case, the laser resonator 112b is operated to generate the continuous wave and the optical modulator 114b modulates the output generated from the laser resonator 112b to output the pulse signal or the standby signal and the operation thereof is controlled by the pulse output control unit 116b.

The laser generator having the above configuration may use a single laser source to selectively generate the pulse signal and the standby signal which is the continuous wave.

Figure 9:
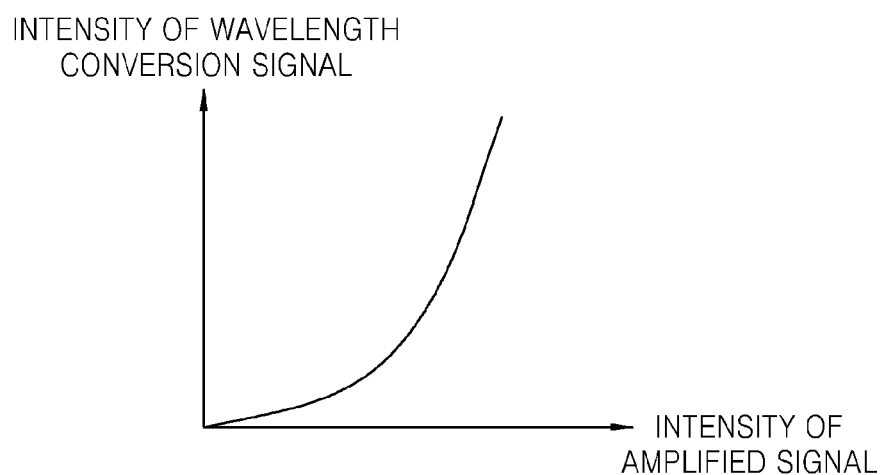
FIG. 9 is a graph illustrating a relationship between an intensity of an amplified signal (input light) and an intensity of a wavelength conversion signal (output light) in a nonlinear wavelength converter.

FIG. 9 is a graph illustrating a relationship between the intensity of the amplified signal (input light) and the intensity of the wavelength conversion signal (output light) in the nonlinear wavelength converter.

Referring to FIG. 9, the wavelength conversion signal output from the nonlinear wavelength converter is nonlinearly (high order of second order or more) converted with respect to the intensity of the input amplified signal.

When the amplified signal output from the optical amplifier is input to the nonlinear wavelength converter, the pulse signal having a strong peak output is effectively wavelength-converted, but the standby signal having a weak peak output is not substantially wavelength-converted.

Since the optical amplifier uniformly excites the energy, a difference between the average output of the amplified signal corresponding to the pulse signal and the average output of the amplified signal corresponding to the standby signal is not large.

Generally, the average output of the continuous wave is large on the order of several % to tens of % in a region in which a period of a pulse is 1/10 or shorter than the saturation time is of the amplifier medium.

On the other hand, the peak output is in an inverse proportion to the duty ratio of the pulse and the peak output of the pulse output is high. For example, the pulse width is 10 nanosecond (ns) and even though the average output of the pulse output and the average output of the continuous wave of which the pulse repetition rate is 100 kHz (period of 10 microsecond (μs)) are the same, the peak output therebetween has a difference of 1000 times.

When the output is input to the nonlinear wavelength converter, the wavelength conversion signal has a difference of 1,000,000 times in a second-order nonlinear conversion and a difference of 1,000,000,000 times in a third-order nonlinear conversion, in terms of the peak output. Therefore, the continuous wave signal of which the standby signal input to the nonlinear wavelength converter optimized for the wavelength conversion of the pulse output signal of the amplifier is amplified is not substantially wavelength-converted. Therefore, the pulse signal which is not wavelength-converted and the input wavelength signal corresponding to the standby signal may be easily removed by the subsequent optical separator.

Figure 10:
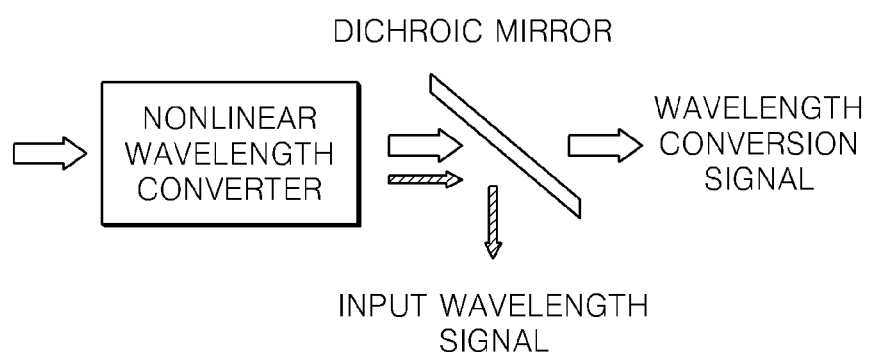
FIG. 10 is a conceptual diagram illustrating a case in which a dichroic mirror is used as an optical separator.

FIG. 10 is a conceptual diagram illustrating a case in which a dichroic mirror is used as an optical separator.

As described above, the wavelength of the pulse signal having the high peak output is effectively converted by the nonlinear wavelength converter, but the wavelength of the standby signal having the low peak output is not substantially changed.

As the optical separator, a dichroic mirror, a prism, a grating, or the like, may be used. As illustrated, in case of using the dichroic mirror, the dichroic mirror reflects the wavelength conversion signal corresponding to the pulse signal and transmitting the pulse signal and the continuous wave signal which are not wavelength-converted, thereby separating the two signals.

Figure 11:
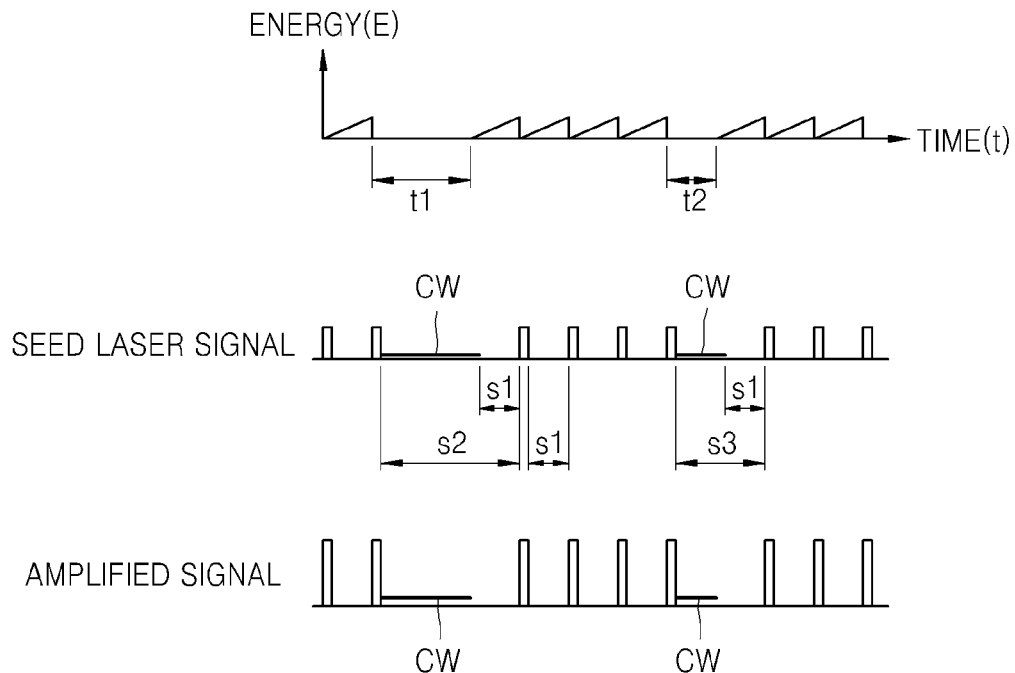
FIG. 11 is a graph illustrating a seed laser signal, an amplified signal, and an energy distribution accumulated in the amplification medium of the amplifier over time when the laser device according to the present invention is operated in a burst mode.

FIG. 11 is a graph illustrating the seed laser signal, the amplified signal, and the energy distribution accumulated in the amplification medium of the amplifier over time when the laser device according to the present invention is operated in a burst mode.

According to the present invention, in a method for controlling a burst mode of a pulse laser device including a laser generator which generates the seed laser signal and an optical amplifier which amplifies the seed laser signal to generate the amplified signal, when a time s2 or s3 of a quiet period in which the pulse signal is not generated exceeds a time s1 of the quiet period, the standby signal is generated as much as a time t1 or t2 (where t1=s2−s1, t2=s3−s1) exceeding a reference quiet period.

To operate the pulse laser device according to the present invention in the burst mode operation, when the pulse signal is not input to the optical amplifier for a predetermined time (t1 or t2 of FIG. 11), since the continuous wave (CW) which is the standby signal is input to the optical amplifier, the output signal of the optical amplifier becomes also the lower continuous wave (CW) having the low peak output.

Since the energy of the amplifier is consumed due to the amplification of the continuous wave, the continuous energy accumulation in the amplifier medium is prevented, such that it is possible to prevent the pulse from being very strongly amplified when the pulse signal is input to the optical amplifier again. Therefore, the damage to the amplification terminal and the optical system may be prevented and the instability of the laser output may be prevented.

Figure 12:
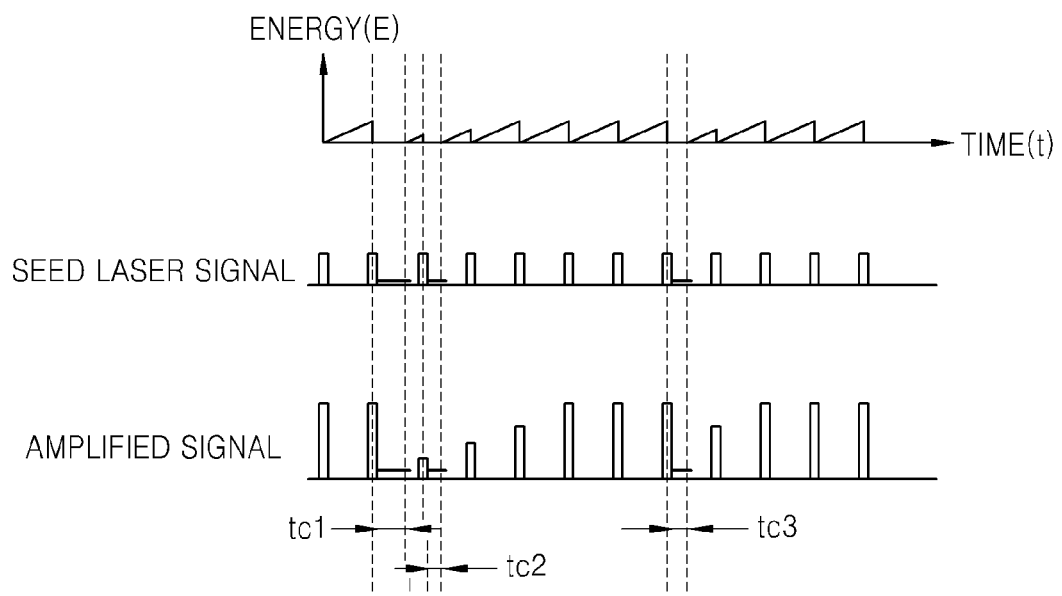
FIG. 12 is a graph illustrating a seed laser signal, an amplified signal, and an energy distribution accumulated in the amplification medium of the amplifier over time when the laser device according to the present invention is operated in a variable burst mode.

FIG. 12 is a graph illustrating the seed laser signal, the amplified signal, and the energy distribution accumulated in the amplification medium of the amplifier over time when the laser device according to the present invention is operated in a variable burst mode.

According to the present invention, in a control method for enabling the variable burst mode operation of the pulse laser device including a laser generator which generates the seed laser signal including the pulse signal and the standby signal and the optical amplifier which amplifies the seed laser signal to generate the amplified signal, in the quiet period in which the laser generator is controlled and the pulse signal is not generated, the peak outputs of each of the subsequent pulse signals are controlled by varying the generation time of the standby signal and thus the profile of the pulse train is controlled.

Referring to FIG. 12, when the generation time of the standby signal of the seed laser signal input to the optical amplifier varies like tc1, tc2, and tc3, the energy accumulated in the optical amplifier also varies, such that the pulse signal following after the generation of the standby signal has an amplified magnitude which varies depending on the amount of energy accumulated in the optical amplifier.

Therefore, the intensity of the amplified output pulses may each be controlled by making the generation time of the standby signal between the respective pulse signals different. As described above, the nonlinear wavelength converter wavelength-converts the amplified signal which is the output of the optical amplifier to output the wavelength conversion signal and performs the wavelength conversion depending on the intensity of each of the input amplified signals. By the method, the output pulse which is finally output is not simply on-off but the intensity of each of the pulses is controlled, thereby implementing the variable burst mode which controls the profile of the pulse train into an arbitrary form.

According to the present invention, when the optical pulse is not periodically input and the input optical pulse is not input for a predetermined time, the problem in that the energy accumulated in the amplified medium is very large is improved, and thus the problem in that the amplifier medium is damaged due to the input optical pulse which is very largely amplified is solved.

The present invention proposes a method which is operated in the variable burst mode by interaction with the nonlinear wavelength converter by generating the pulse using a method for controlling an output in the pulse generator.

According to the present invention, to prevent the energy of the optical amplifier from being accumulated in a time domain which does not want the output of the signal pulse, the low-output continuous wave is generated and is input to the amplifier, thereby preventing the spike output of the amplifier and the damage to the amplifier. Further, the generation time of the continuous wave which is the standby signal is controlled and thus the magnitude of each pulse is controlled, thereby implementing the variable burst mode.

Figure 13:
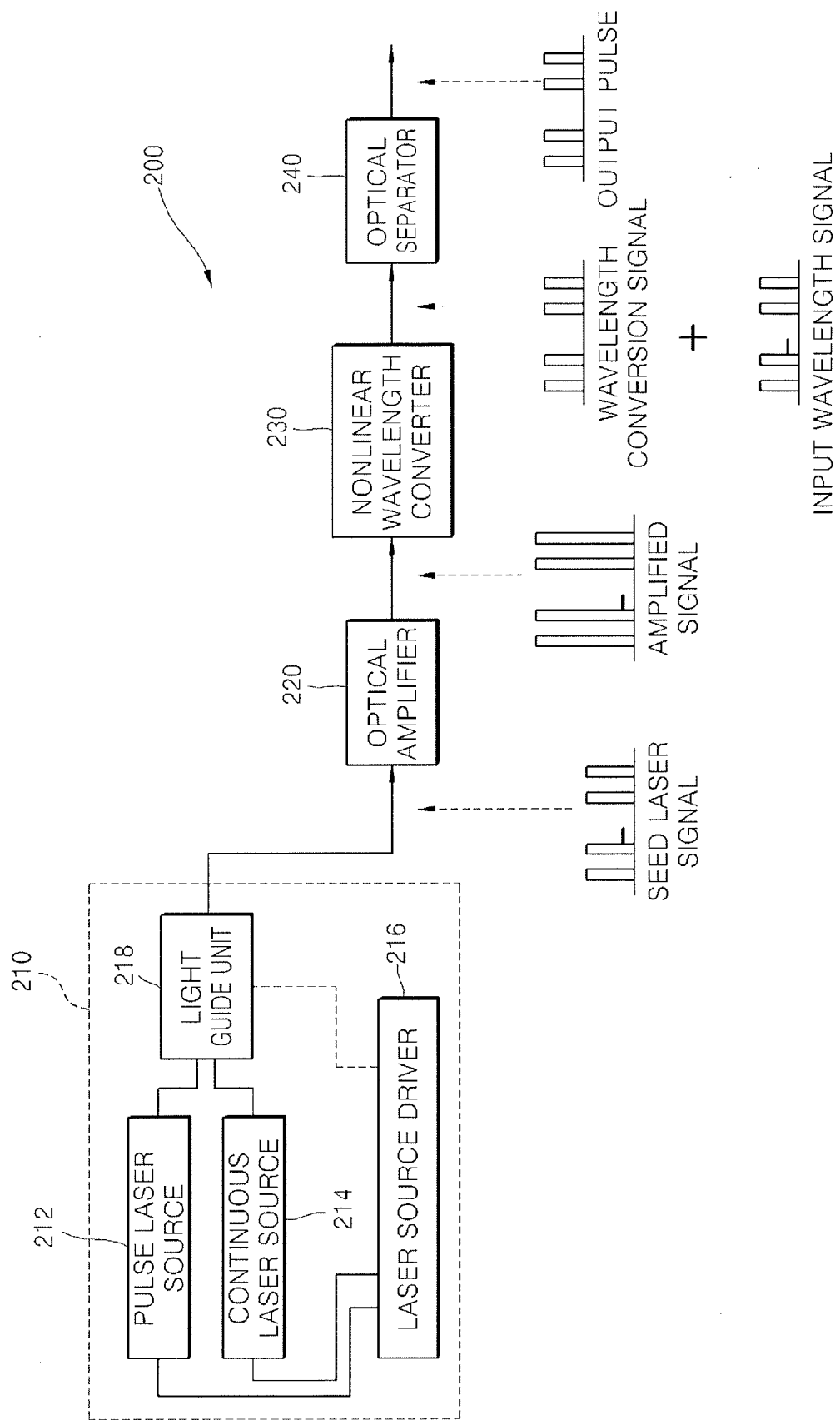
FIG. 13 is a block diagram illustrating a configuration of a pulse laser device according to another embodiment of the present invention.

FIG. 13 is a block diagram illustrating a configuration of the pulse laser device according to the embodiment of the present invention.

As illustrated, a pulse laser device 200 according to the present invention includes a laser generator 210 which outputs a seed laser signal including an optical pulse and a continuous wave, an optical amplifier 220 which amplifies the seed laser signal to output an amplified signal, a nonlinear wavelength converter 230 which nonlinearly outputs a wavelength conversion signal depending on an intensity of the amplified signal, and an optical separator 240 which separates an output pulse from the wavelength conversion signal.

The laser generator 210 may output both of the optical pulse and the continuous wave as the seed laser signal, in which the continuous wave is output in a quiet period in which the optical pulse is not output.

The laser generator 210 includes a pulse laser source 212 which outputs the optical pulse, a continuous laser source 214 which outputs the continuous wave, a laser source driver 216 which controls an operation time of the pulse laser source 212 and the continuous laser source 214, and a light guide unit 218 which guides the seed laser output from the pulse laser source 212 and the continuous laser source to the subsequent optical amplifier.

The pulse laser source 212 generates the optical pulse and may be configured to include a laser diode or a low-output resonator.

The continuous laser source 214 generates a continuous wave and may be configured to include a laser diode or a laser resonator.

The continuous wave output from the continuous laser source 214 is to consume the energy accumulated in the subsequent optical amplifier 220. In this case, the continuous wave is preferably a continuous wave (CW) and the output magnitude thereof is preferably a magnitude obtained by multiplying a duty ratio by a peak output. That is, the output magnitude of the continuous wave is preferably similar to the average output of the optical pulse. When the output magnitude of the continuous wave is even smaller than the average output of the optical pulse, the amplification by the continuous wave is not sufficiently generated in the amplifier and thus the energy consumption of the amplifier by the continuous wave is insufficient, such that the excessive amplification of the subsequent pulse signal may occur.

Although the output magnitude of the continuous wave may be different depending on the characteristics of the amplifier, the output magnitude of the continuous wave needs to be operated at a magnitude of at least 10% of the average output of the optical pulse, preferably 50% or more. When the signal amplified by the amplifier has a large amplification factor, an intensity of the amplified output light mainly depends on an intensity of excitation light rather than on an intensity of incident light. Therefore, when the intensity of the output of the continuous wave input to the amplifier is larger than the intensity of the average output of the optical pulse, the average output of the amplifier may be slightly changed, but when the standby signal does not have an enough magnitude to cause the damage to the optical system of the input unit of the amplifier, no problem is caused to the performance of the present invention.

The seed laser signals output from the two laser sources 212 and 214 need to be input to the single optical amplifier 220 and therefore the present invention includes the light guide unit 218.

As the light guide unit 218, an optical fiber coupler which is a passive element may be used and in this case, the light guide unit 218 needs not to be controlled by the source driver 216.

However, when the light guide unit 218 includes an optical switch which is an active element, the light guide unit 218 is controlled together with the pulse laser source 212 and the continuous laser source 214 by the laser source driver 216.

Herein, the optical switch serves to selectively output each input signal to an output unit by a control signal and according to the present invention, is driven by a signal to the laser source driver and is controlled to output the optical pulse output from the pulse laser source 212 to the optical amplifier 220 or output the continuous wave output from the continuous laser source 214 to the optical amplifier 220. As the optical switch, the optical fiber switch coupled with an optical fiber is mainly used.

Further, the light guide unit 218 may be also configured of free space optics such as a polarizer which is a passive element.

The optical amplifier 220 may be formed by connecting a plurality of amplifiers in a multi stage. The optical amplifier 220 may include an optical fiber amplifier or a laser crystal amplifier. In more detail, a single optical fiber amplifier, a multi-stage optical fiber amplifier, a single crystal amplifier, a multi-stage crystal amplifier, and a form in which the multi-stage optical fiber amplifier and the multi-stage crystal amplifier are coupled with each other may be used, but the present invention is not limited thereto.

The nonlinear wavelength converter 230 nonlinearly wavelength-converts the amplified signal output from the optical amplifier 220 to output the wavelength conversion signal.

When the amplification signal of the optical amplifier 220 is input to the nonlinear wavelength converter 230, the optical pulse having a strong peak output is effectively wavelength-converted, but the continuous wave having a weak peak output is not substantially wavelength-converted. Generally, in the wavelength converter optimized for the pulse signal, the pulse signal is wavelength-converted as much as several % to tens of % and the continuous wave (CW) signal having the same average output is not substantially wavelength-converted. Therefore, when the pulse signal is input to the wavelength converter, the wavelength conversion signal of several to tens of % and the rest input wavelength signal which is not wavelength-converted is output and when the continuous wave signal is input, the wavelength conversion is not substantially generated and the input wavelength signal is output as it is.

The optical separator 240 serves to separate the wavelength-converted signal in the output of the nonlinear wavelength converter from the input wavelength signal which is not wavelength-converted. Therefore, the final output signal becomes the wavelength-converted pulse output.

Figure 14:
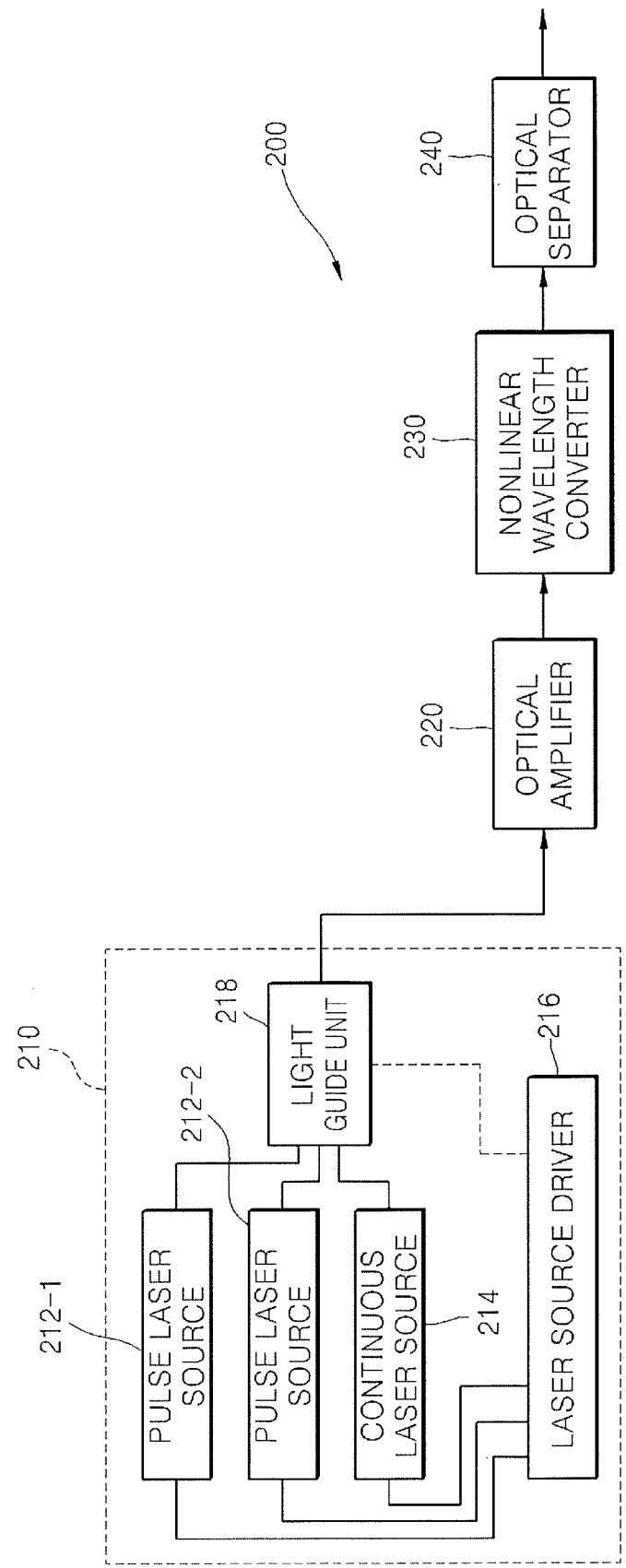
FIG. 14 is a block diagram illustrating a configuration of a pulse laser device according to another embodiment of the present invention.

FIG. 14 is a block diagram illustrating a configuration of a pulse laser device according to another embodiment of the present invention.

Figure 15:
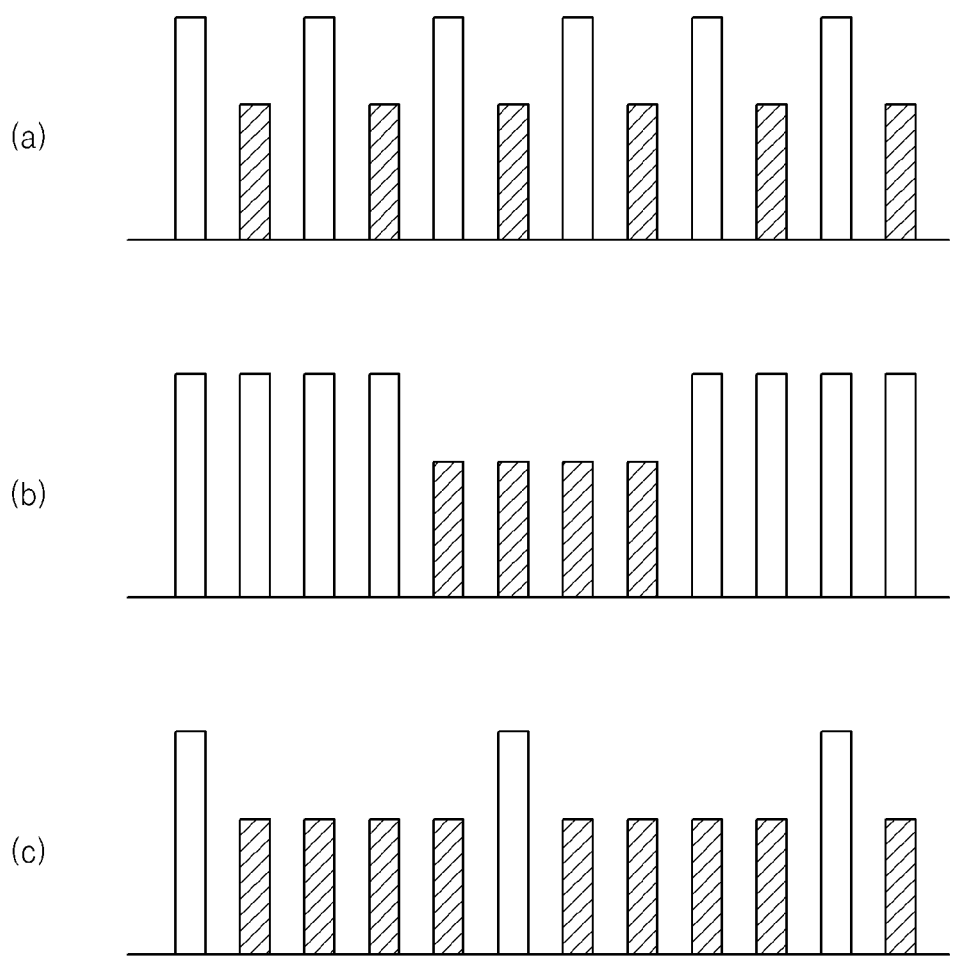
FIG. 15 is a graph exemplarily illustrating various output pulses which may be implemented by two pulse laser sources.

The present embodiment includes a plurality of pulse laser sources 212-1 and 212-2. In this case, each pulse laser source 212-1 and 212-2 output optical pulses having different wavelengths. FIGS. 15, 18, and 19 illustrate that the optical pulse which is not hatched is output from the first pulse laser source 212-1 and the hatched optical pulse is output from the second pulse laser source 212-2.

Even in this case, the operation of each pulse laser source 212-1 and 212-2 is controlled by the laser source driver 216 and the pulse laser source 212-1 and 212-2 are driven by being operated with each other.

Further, the light guide unit 218 guides the seed laser signal output from three sources to the optical amplifier 220.

The present embodiment describes that the two pulse laser sources 212-1 and 212-2 are provided; however, three or more pulse laser sources may be provided and even in this case, are operated with the same principle.

When the plurality of pulse laser sources outputting the optical pulses having different wavelengths are provided, a time interval between the pulses of each wavelength and an operation time of the continuous wave are controlled and thus the magnitude of the output signal of the amplifier of each pulse is controlled, thereby generating more various types of final output pulses. The magnitude of the final output light depending on the wavelength varies depending on the amplification efficiency of the wavelength of the amplifier and the efficiency of the wavelength converter.

FIG. 15 exemplarily illustrates various output pulses which can be implemented by the two pulse laser sources.

FIG. 15(a) illustrates that the two pulse laser sources are alternately operated, the optical pulses are alternately output, and different peak outputs appear.

FIG. 15(b) illustrates that after the optical pulse train is output from the single pulse laser source and then the optical pulse train is output from another pulse laser source and different peak outputs appear.

FIG. 15(c) illustrates the case in which the repetition rates of the optical pulses output from each pulse laser source are different.

Except for exemplarily illustrated ones, it can be understood to those skilled in the art that various types of output pulses can be generated.

Figure 16:
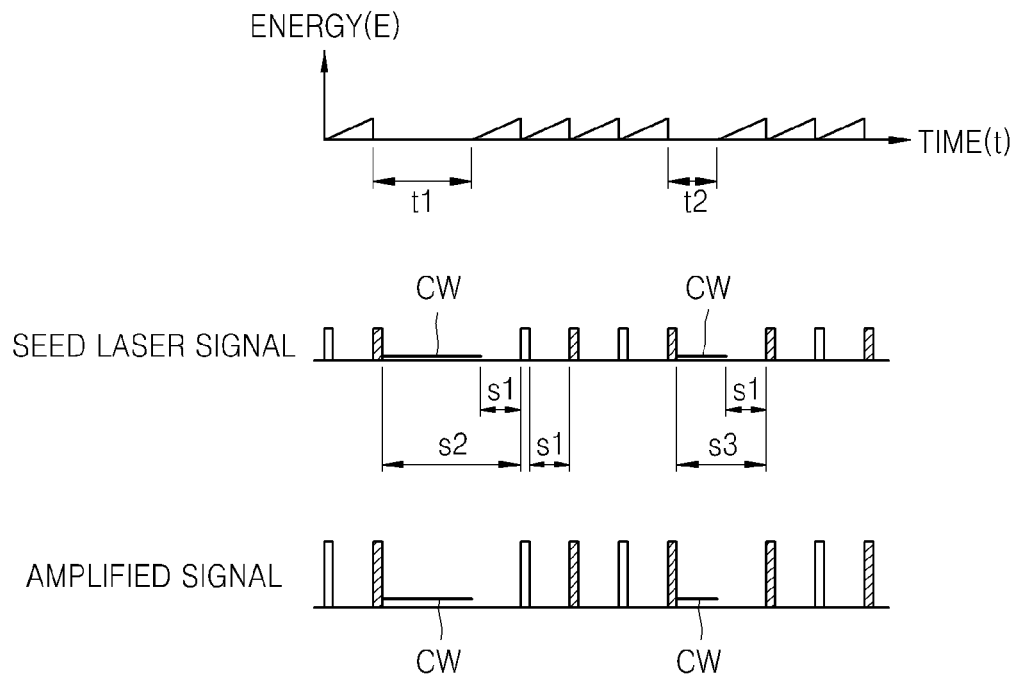
FIG. 16 is a graph illustrating a seed laser signal, an amplified signal, and an energy distribution accumulated in the amplification medium of the amplifier over time when the laser device according to another embodiment of the present invention is operated in a burst mode.

FIG. 16 is a graph illustrating the seed laser signal, the amplified signal, and the energy distribution accumulated in the amplification medium of the amplifier over time when the laser device according to another embodiment of the present invention is operated in the burst mode.

In a method for controlling a burst mode of a pulse laser device including: a laser generator including at least one pulse laser source which outputs the optical pulse, a continuous laser source which outputs a continuous wave, a laser source driver which controls an operation time of the pulse laser source and the continuous laser source, and a light guide unit which guides the seed laser signals generated from the pulse laser source and the continuous laser source to the subsequent optical amplifier; an optical amplifier which amplifies the seed laser signal; a wavelength converter which nonlinearly wavelength-converts the signal of the optical amplifier; and an optical separator which separates the signal of the wavelength converter depending on the wavelength.

When the time of the quiet period in which the optical pulse is not generated exceeds the time of the reference quiet period, the laser source driver of the laser generator operates the continuous laser source as much as the exceeding time of the reference quiet time to output the continuous wave.

To operate the pulse laser device according to the present invention in the burst mode, when the pulse is not input to the amplifier for a predetermined time at the time of modulating the pattern of the pulse train over time (t1 and t2 of FIG. 16), since the continuous wave (CW) of the amplifier is input to the amplifier, the output signal of the amplifier is also output as the continuous wave (CW) having a low peak output.

Since the energy of the amplifier is consumed due to the amplification of the continuous wave, the continuous energy accumulation in the amplifier medium is prevented, such that it is possible to prevent the pulse from being very strongly amplified when the pulse signal is input to the optical amplifier again. Therefore, the damage to the amplification terminal and the optical system may be prevented and the instability of the laser output may be prevented.

Figure 17:
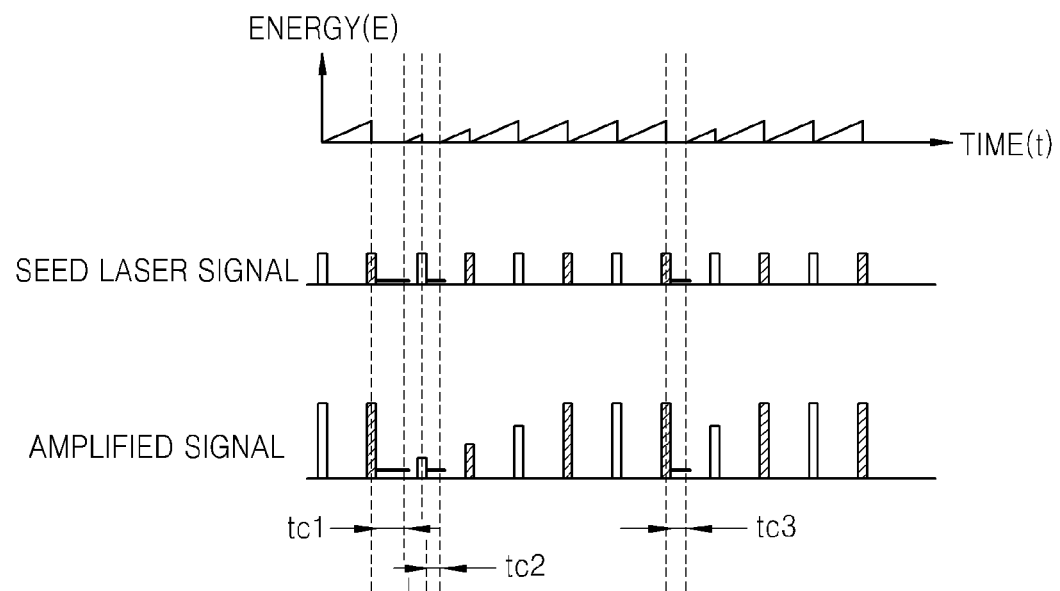
FIG. 17 is a graph illustrating a seed laser signal, an amplified signal, and an energy distribution accumulated in the amplification medium of the amplifier over time when the laser device according to the present invention is operated in a variable burst mode by allowing the laser device to include a pulse generation unit as a plurality of pulse laser sources and continuous wave sources having different wavelengths.

FIG. 17 is a graph illustrating the seed laser signal, the amplified signal, and the energy distribution accumulated in the amplification medium of the amplifier over time when the laser device according to the present invention is operated in a variable burst mode.

In a method for controlling a variable burst mode of a pulse laser device including: a laser generator including at least one pulse laser source which outputs the optical pulse, a continuous laser source which outputs a continuous wave, and a laser source driver which controls the operations of the pulse laser source and the continuous laser source, and a light guide unit which guides the seed laser signals generated from the pulse laser source and the continuous laser source to the subsequent optical amplifier; and an optical amplifier which amplifies the seed laser signal, the laser source driver of the laser generator varies the operation time of the continuous laser source in the quiet period in which the optical pulse is not generated to control the peak outputs of each of the subsequent optical pulses, thereby controlling the profile of the pulse train.

Referring to FIG. 17, when the generation time of the continuous wave of the seed laser signal input to the optical amplifier varies like tc1, tc2, and tc3, the energy accumulated in the optical amplifier also varies, such that the optical pulse following after the generation of the continuous wave has an amplified magnitude which varies depending on the amount of energy accumulated in the optical amplifier.

Therefore, the intensity of the amplified output pulses may be controlled by making the generation time of the continuous wave between the respective pulses different. As described above, the nonlinear wavelength converter wavelength-converts the amplified signal which is the output of the optical amplifier to output the wavelength conversion signal and nonlinearly performs the wavelength conversion depending on the intensity of each of the input amplified signals. By the method, the output pulse which is finally output is not simply on-off but the intensity of each of the pulses is controlled, thereby implementing the variable burst mode which controls the profile of the pulse train into an arbitrary form.

According to the embodiment of the present invention, when the optical pulse is not periodically input and the input optical pulse is not input for a predetermined time, the problem in that the energy accumulated in the amplified medium is very large is improved, and thus the problem in that the amplifier medium and the subsequent optical system are damaged due to the input optical pulse which is very largely amplified is solved.

The present invention proposes a method which is operated in the variable burst mode by interaction with the nonlinear wavelength converter by generating the pulse using a method for controlling an output in the pulse generator.

According to the embodiment of the present invention, to prevent the energy of the optical amplifier from being accumulated in a time domain which does not want the output of the signal pulse, the low-output continuous wave is generated and is input to the amplifier, thereby preventing the spike output of the amplifier and the damage to the amplifier. Further, the generation time of the continuous wave is controlled and thus the magnitude of each pulse is controlled, thereby implementing the variable burst mode.

The invention claimed is:

1. A pulse laser device, comprising:
    a laser generator including
        a pulse laser source which outputs seed laser signals including pulse signals and standby signals, wherein a standby signal is generated in a quiet period between two pulse signals,
        a continuous laser source which outputs a continuous wave,
        a laser source driver which controls an operation time of the pulse laser source and the continuous laser source, and
        a light guide unit which guides the seed laser signals generated from the pulse laser source and the continuous laser source to a subsequent optical amplifier,
    wherein the optical amplifier amplifies the seed laser signals,
    wherein the laser source driver drives the pulse laser source and the continuous laser source together to control energy, which is accumulated in the optical amplifier while the pulse signal is not input for a predetermined time, by the standby signals which consume the energy in real time based on the amplification of the continuous wave;
    a nonlinear wavelength converter which nonlinearly outputs a wavelength conversion signal depending on an intensity of the amplified signal; and
    an optical separator which separates light output from the continuous laser source from the wavelength conversion signal.

2. The pulse laser device of claim 1, wherein the pulse laser source or the continuous laser source includes a laser diode.

3. The pulse laser device of claim 1, wherein the light guide unit includes an optical fiber coupler.

4. The pulse laser device of claim 1, wherein the light guide unit is an optical fiber switch which is controlled by the laser source driver.

5. The pulse laser device of claim 1, wherein the pulse laser device includes at least two pulse laser sources.

6. The pulse laser device of claim 5, wherein each of the pulse laser sources outputs optical pulses having different wavelengths.

7. The pulse laser device of claim 1, wherein the optical amplifier includes an optical fiber amplifier or a laser crystal amplifier.

* * * * *